United States Patent
Hung et al.

(10) Patent No.: US 9,391,562 B2
(45) Date of Patent: Jul. 12, 2016

(54) LOCAL OSCILLATION GENERATOR, ASSOCIATED COMMUNICATION SYSTEM AND METHOD FOR LOCAL OSCILLATION GENERATION

(71) Applicant: MStar Semiconductor, Inc., Hsinchu Hsien (TW)

(72) Inventors: Chih-Ming Hung, Hsinchu County (TW); Keng-Meng Chang, Hsinchu County (TW); Yao-Chi Wang, Hsinchu (TW); Chih-Wei Chang, Hsinchu (TW)

(73) Assignee: MSTAR SEMICONDUCTOR, INC., Hsinchu Hsien (TW)

( * ) Notice: Subject to any disclaimer, the term of this patent is extended or adjusted under 35 U.S.C. 154(b) by 243 days.

(21) Appl. No.: 14/038,905

(22) Filed: Sep. 27, 2013

(65) Prior Publication Data

US 2014/0092892 A1 Apr. 3, 2014

(30) Foreign Application Priority Data

Sep. 28, 2012 (TW) .............................. 101135865 A

(51) Int. Cl.
*H04B 1/40* (2015.01)
*H04B 7/12* (2006.01)
*H03B 28/00* (2006.01)
*H04J 3/02* (2006.01)
*H03B 27/00* (2006.01)

(52) U.S. Cl.
CPC .............. *H03B 28/00* (2013.01); *H03B 27/00* (2013.01); *H04J 3/02* (2013.01)

(58) Field of Classification Search
CPC ................................ H04J 3/025; H04B 27/00
See application file for complete search history.

(56) References Cited

U.S. PATENT DOCUMENTS

| 6,496,142 | B1 * | 12/2002 | Iinuma | H01Q 3/26 |
| | | | | 342/368 |
| 7,809,338 | B2 | 10/2010 | Tsfaty | |
| 2006/0281419 | A1 * | 12/2006 | Peplinski | H04B 1/403 |
| | | | | 455/83 |
| 2008/0002788 | A1 * | 1/2008 | Akhtar et al. | 375/298 |
| 2008/0055010 | A1 * | 3/2008 | Lerner et al. | 331/37 |
| 2008/0056337 | A1 * | 3/2008 | Tal et al. | 375/219 |

(Continued)

FOREIGN PATENT DOCUMENTS

TW 201206137 2/2012

OTHER PUBLICATIONS

Taiwan Intellectual Property Office, "Office Action", Jan. 30, 2015.

(Continued)

*Primary Examiner* — Shaq Taha

(74) *Attorney, Agent, or Firm* — WPAT, PC; Justin King; Douglas Hosack

(57) ABSTRACT

A local oscillation generator includes a multi-phase circuit and a multiplexer. The multi-phase oscillator provides a plurality of multi-phase oscillation signals of a same frequency and different phases. The multiplexer conducts one of the multi-phase oscillation signals to an output end in different time slots to provide an output oscillation signal. The frequency of the multi-phase oscillation signals is the same as a fundamental frequency, and the frequency of the output oscillation signal is different from the fundamental frequency. Thus, the local oscillation generator provides a local oscillation signal according to the output oscillation signal such that the fundamental frequency is different from the frequency of the local oscillation signal.

30 Claims, 6 Drawing Sheets

(56) References Cited

U.S. PATENT DOCUMENTS

2009/0081978 A1* 3/2009 Chen et al. .................. 455/255
2009/0311972 A1* 12/2009 Husted .................. H03C 5/00
455/76

OTHER PUBLICATIONS

Nuntachai Poobuapheun, "LNA and Mixer Designs for Multi-Band Receiver Front-Ends", Technical Report No. UCB/EECS-2009-107, Aug. 1, 2009.
Shi-Huang Chen, "Chapter 9: Shift Registers", 2010.

* cited by examiner

LOCAL OSCILLATION GENERATOR, ASSOCIATED COMMUNICATION SYSTEM AND METHOD FOR LOCAL OSCILLATION GENERATION

This application claims the benefit of Taiwan application Serial No. 101135865, filed Sep. 28, 2012, the subject matter of which is incorporated herein by reference.

BACKGROUND OF THE INVENTION

1. Field of the Invention

The invention relates in general to a local oscillation generator, an associated communication system and a method for local oscillation generation, and more particularly, to a local oscillation generator capable of preventing an amplifier of a communication system from interfering a local oscillator, an associated communication system and a method for local oscillation generation.

2. Description of the Related Art

Communication networks in various standards, such as WLAN, Bluetooth, Mobile Communications, satellite positioning and digital televisions, are an essential part of the modern information society. A communication network includes a transmission end and a reception end. To fully utilize communication channels as well as performing multiplexed accesses, the transmission end and the reception end are provided with respective local oscillation generators for generating local oscillation signals. For example, in a radio-frequency (RF) wireless communication network, the transmission end first encodes information to be transmitted to the communication network into a baseband signal, and a local oscillation signal provided by the local oscillation generator at the transmission end serves as a modulation carrier. By mixing the baseband signal with the carrier, the baseband signal can be modulated and up-converted to an RF signal. A power amplifier at the transmission end further amplifies the power of the RF signal so as to transmit the RF signal to a communication network medium, such as air. Correspondingly, after receiving the RF signal via the communication network medium at the reception end, a local oscillation signal generated by the local oscillation generator of the reception end serves as a demodulation carrier. By mixing the RF signal with the demodulation signal, the RF signal can be demodulated and down-converted to a baseband signal to restore original information before the transmission.

In a local oscillation generator of the prior art, an original oscillation signal is generated by an oscillator, and the original oscillation signal is frequency-divided by an integer to generate a local oscillation signal. For example, assuming a local oscillation frequency required by the local oscillation signal is 2.4 GHz, in such prior art, an original oscillation signal in a 4.8 GHz or 9.6 GHz frequency is generated by the oscillator and is then frequency-divided by 2 or 4 to obtain the 2.4 GHz oscillation signal. On the other hand, due to non-linearity of circuits at the reception end or the transmission end, the local oscillation signal may trigger multiple-frequency harmonic oscillation signals, whose frequency, e.g., 4.8 GHz or 9.6 GHz, is an integral multiple of the local oscillation frequency. However, in such prior art, as the original oscillation frequency based on which the oscillator operates is also an integral multiple of the local oscillation frequency, the multiple-frequency harmonic oscillation signals of the local oscillation signal impose an undesirable effect on operations of the oscillator to thus degrade the communication quality.

For example, at the transmission end, the power amplifier amplifies the power of the RF signal, with the associated non-linearity causing high-power multiple-frequency harmonic oscillation signals. Assuming that the original oscillation frequency that the oscillator utilizes for providing the original oscillation signal is also an integral multiple of the local oscillation signal in a way that a certain multiple-frequency harmonic oscillation signal is extremely approximate to the original oscillation frequency, the frequency of the multiple-frequency harmonic oscillation signals of the power amplifier then causes a frequency pulling effect upon the oscillator. Consequently, an error vector magnitude (EVM) of the transmission end is deteriorated to lead to reduced signal quality. Such occurrence is particularly severe in 2G/3G/4G mobile communication networks and WLAN, as the power amplifier operates at a higher power such as 15 to 30 dBm in the transmission end of these wireless networks.

SUMMARY OF THE INVENTION

The invention is directed to a local oscillation generation technique for solving the above issues of the prior art.

According to an object of the present invention, a local oscillation generator, for providing a local oscillation signal in a communication system (e.g., a transmission end or a reception end), is provided. The local oscillation generator comprises a multi-phase circuit (e.g., a poly-phase filter) and a multiplexer. The local oscillation generator may further comprise an oscillator, which is coupled to the multi-phase circuit and for providing a fundamental oscillation signal having a frequency regarded as a fundamental frequency. The multi-phase circuit provides a plurality of multi-phase oscillation signals according to the fundamental oscillation frequency. The multi-phase oscillation signals have a same fundamental frequency and different phases. The multiplexer is coupled to the multi-phase circuit, and respectively conducts one of the multi-phase oscillation signals in a plurality of different time slots to form an output oscillation signal. The local oscillation generator provides the local oscillation signal according to the output oscillation signal. A frequency of the output oscillation signal is different from the fundamental frequency. For example, in one embodiment, the frequency of the output oscillation frequency may be greater than the fundamental frequency, and is a non-integral multiple of the fundamental frequency and an integral multiple (one or more times) of the local oscillation frequency, such that the fundamental frequency is a non-integral multiple of the frequency of the local oscillation signal. As such, the integral-multiple harmonics of the local oscillation frequency do not coincide the fundamental frequency based on which the oscillator operates, thereby suppressing the pulling effect of the local oscillation frequency upon the oscillator.

A period of the multi-phase oscillation signals is a fundamental period. In one embodiment, the multiplexer periodically conducts the same multi-phase oscillation signal according to a conduction period. A time difference exists between two multi-phase oscillation signals conducted by the multiplexer in two adjacent time slots, and the conduction period may equal to the time difference multiplied by the number of the multi-phase oscillation signals. For example, assume there are four multi-phase oscillation signals, the phases are respectively 0, 90, 180 and 270 degrees, and the fundamental period is T. Thus, the time difference may be (3/4)*T (equal to a phase difference of 270 degrees), and the conduction period is (3/4)*T*4=3*T.

In one embodiment, a time length of the time slots in which the multiplexer conducts the multi-phase oscillation signals may be greater than one-half of the period (the fundamental period) of the multi-phase oscillation signals, and smaller than the period of the multi-phase oscillation signals. The frequency of the output oscillation signal is a synthesized frequency. In one embodiment, a ratio of the time length of the time slots to the fundamental period is equal to a ratio of the fundamental frequency to the synthesized frequency. For example, assume there are four multi-phase oscillation signals, the phases are 0, 90, 180 and 270 degrees, the fundamental period is T, and the fundamental frequency is a reciprocal 1/T. Thus, the time length of the time slots may be (3/4)*T (equal to a phase difference of 270 degrees), a period of the output oscillation signal is (3/4)*T, and the synthesized frequency is (4/3)*(1/T) ((4/3) of the reciprocal 1/T). Therefore, the ratio of the fundamental frequency to the synthesized frequency is (3/4), which is equal to the ratio of the time slots (3/4)*T to the fundamental period T.

In one embodiment, a phase difference exists between two multi-phase oscillation signals conducted by the multiplexer in two adjacent time slots, with the phase difference being between 180 degrees and 360 degrees. The ratio of the fundamental frequency to the synthesized frequency is equal to the ratio of the phase difference to the 360 degrees. For example, assume there are four multi-phase oscillation signals, the phases are 0, 90, 180 and 270 degrees, and two multi-phase oscillation signals conducted in two adjacent time slots may have a phase difference of 270 degrees, so as to accordingly provide a synthesized frequency of (4/3)(1/T). Thus, the ratio of the fundamental frequency to the synthesized frequency is (3/4), and the ratio of the phase difference of 270 degrees to 360 degrees is also (3/4).

In one embodiment, the local oscillation generator further comprises a controller for providing a control signal according to the output oscillation signal. The multiplexer conducts one of the multi-phase oscillation signals according to the control signal to form the output oscillation signal. In one embodiment, the controller switches the multiplexer, via the control signal, to conduct to another multi-phase oscillation signal from one of the multi-phase oscillation signals during a transition of the output oscillation signal.

In one embodiment, the controller comprises a first flip-flop and a second flip-flop. The first flip-flop has a first input end, a first clock end and a first output end. The first clock end is coupled to the output oscillation signal. The second flip-flop has a second input end, a second clock end, a second positive output end and a second negative output end. The second input end, the second clock end and the second negative output end are coupled to the first output end, the output oscillation signal and the first input end, respectively. The controller provides the control signal according to signals at the first output end and the second positive output end.

In one embodiment, the multi-phase circuit is a poly-phase filter for generating the multi-phase oscillation signals according to the fundamental oscillation signal. In one embodiment, the multi-phase circuit (and the oscillator) may be integrated and implemented by a ring oscillator.

In one embodiment, the communication system is a transmission end comprising a mixer and a power amplifier. The mixer, coupled to the local oscillation generator, mixes a baseband signal with the local oscillation signal to provide an RF signal. The power amplifier, coupled to the mixer, amplifies the RF signal. In one embodiment, the communication system is a reception end comprising a mixer and an amplifier. The mixer, coupled to the local oscillation generator, mixes an RF signal with the local oscillation signal to provide a baseband signal. The amplifier, coupled to the mixer, amplifies the baseband signal.

In one embodiment, the local oscillation generator further comprises a second multi-phase circuit. The second multi-phase circuit, coupled to the multiplexer, generates a plurality of multi-phase local oscillation signals according to the output oscillation signal. The multi-phase local oscillation signals have a same second fundamental frequency and different phases. The second fundamental frequency is equal to the frequency of output oscillation signal. The local oscillation generator provides the local oscillation signal according to the multi-phase local oscillation signals.

In one embodiment, the local oscillation generator further comprises a frequency divider. The frequency divider, coupled to the multiplexer, frequency divides the output oscillation frequency to generate the local oscillation signal.

According to another object of the present invention, a communication system comprising a local oscillation generator for providing a local oscillation signal is provided. The local oscillation generator comprises a multi-phase circuit and a multiplexer. The multi-phase circuit provides a plurality of multi-phase oscillation signals having a same fundamental frequency and different phases. The multiplexer, coupled to the multi-phase circuit, respectively conducts one of the multi-phase oscillation signals in a plurality of different time slots to form an output oscillation signal. The local oscillation generator provides the local oscillation signal according to the output oscillation signal. A frequency of the output oscillation signal is different from the fundamental frequency.

In one embodiment, the communication system further comprises a mixer and a power amplifier. The mixer mixes a baseband signal with the local oscillation signal to provide an RF signal. The power amplifier amplifies the RF signal.

In one embodiment, the communication system comprises a receiver, to which the local oscillation generator is applied. The communication system further comprises a low-noise amplifier, a mixer and a baseband amplifier. The low-noise amplifier amplifies an RF signal to generate an amplified RF signal. The mixer, coupled to the local oscillation generator, mixes the amplified RF signal with the local oscillation signal to provide a baseband signal. The baseband amplifier, coupled to the mixer, amplifies the baseband signal.

According to yet another object of the present invention, a method for local oscillation generation for providing a local oscillation signal in a communication system is provided. The method comprises: determining a number of a plurality of multi-phase oscillation signals, wherein the multi-phase oscillation signals have a same fundamental frequency and different phases; determining a time difference, wherein a conduction period is equal to the time difference multiplied by the number; periodically conducting one of the multi-phase oscillation signals in a plurality of different time slots according to the conduction period to form an output oscillation signal; and providing the local oscillation signal according to the output oscillation signal so that a frequency of the output oscillation signal is different from the fundamental frequency.

Periods of the multi-phase oscillation signals are a fundamental period of a same length, and the output oscillation signal has a synthesized frequency. In one embodiment, a ratio of a time length of the time slots to the fundamental period is equal to a ratio of the fundamental frequency to the synthesized frequency.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 1:
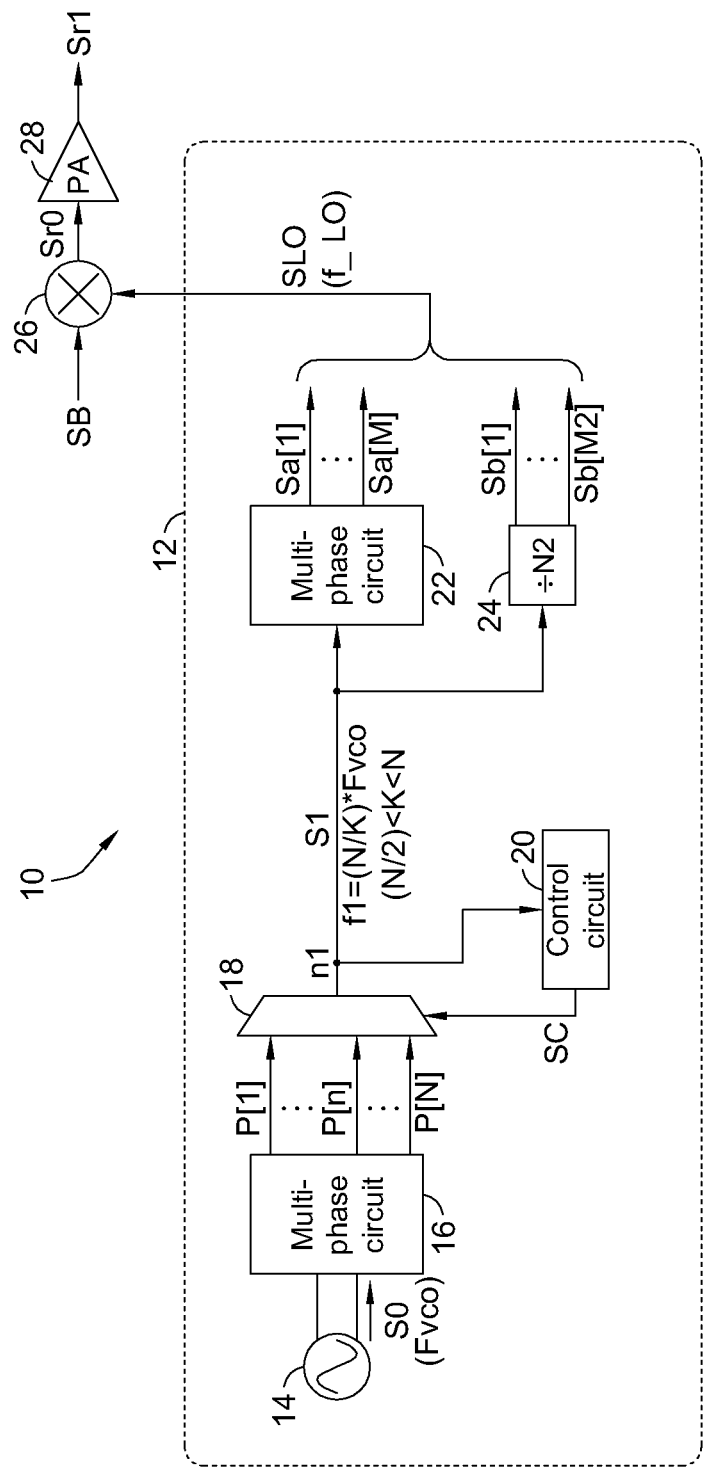
FIG. 1 shows a local oscillation generator according to an embodiment of the present invention.

FIG. 1 shows a local oscillation generator 12 according to an embodiment of the present invention. The local oscillation generator 12 is applied to a communication system 10, e.g., a transmitter of a wireless communication network. Referring to FIG. 1, the local oscillation generator 12 provides one (or more) local oscillation signal(s), which is represented by a signal SLO. The signal SLO has a frequency f_LO, i.e., a local oscillation frequency. The local oscillation generator 12 comprises an oscillator 14, a multi-phase circuit 16, a multiplexer 18 and a control circuit 20. To provide the local oscillation signal SLO, the local oscillation generator 12 may further comprise a multi-phase circuit 22 and/or a frequency divider 24. The communication system 10 comprises a mixer 26 and a power amplifier 28 to form an analog frontend of a network physical layer.

In the local oscillation generator 12, the oscillator 14 may be a voltage-controlled oscillator (VCO) of a phase-locked loop (PLL, not shown) to provide a signal S0 as a fundamental oscillation signal having a frequency Fvco, which may be regarded as a fundamental frequency. The multi-phase circuit 16, coupled to the oscillator 14, operates at the frequency Fvco. According to the signal S0, the multi-phase circuit 16 provides an N number of signals P[1] to P[N] as multi-phase oscillation signals, where the number N is an integer greater than 1. The signals P[1] to P[N] have an oscillation frequency equal to the frequency Fvco but different phases. For example, a phase difference between an $n^{th}$ signal P[n] and the signal P[1] may be (360*(n-1)/N) degrees, where n=1 to N.

The multiplexer 18, coupled to the multi-phase circuit 16, conducts one of the signals P[1] to P[N] to an internal end n1 (i.e., an output end) to generate a signal S1 as an output oscillation signal. The controller 20, coupled to the multiplexer 18, provides a control signal SC according to the signal S1. The multiplexer 18 respectively conducts one of the signals P[1] to P[N] in different time slots according to the control signal SC to generate the signal S1. Accordingly, a frequency f1 of signal S1 is different from the frequency Fvco. For example, a ratio of the frequency f1 to the frequency Fvco may be (N/K), where K is an integer greater than (N/2) and smaller than N. In an embodiment, N is 4 and K is 3. That is, in one embodiment, the frequency f1 of the signal S1 is greater than the fundamental frequency Fvco, and is a non-integral multiple of the frequency Fvco. As such, the issue of frequency pulling can be almost solved. In another embodiment, the ratio of the frequency f1 to the frequency Fvco may be (N/K). When (N/K) is smaller than 1, given that (N/K) is not an integer and the frequency Fvco is not an integral multiple of the frequency f1, operations of the oscillator 14 are effectively prevented from interference of multiple-frequency harmonics of the local oscillation frequency, thereby suppressing the frequency pulling effect imposed by the local oscillation frequency upon the oscillator 14.

In one embodiment of the present invention, according to the signal S1, the multi-phase circuit 22 generates a plurality of signals Sa[1] to Sa[M] of the same frequency and different phases to serve as the local oscillation signals SLO. For example, M may be equal to 4 to provide quadrature-phase local oscillation signals SLO. The multi-phase circuit 22 may be a poly-filter, which is coupled to the multiplexer 18 and operates at the frequency f1. In an alternative embodiment, the frequency divider 24 generates one or more signals Sb[1] to Sb[M2] of the same frequency yet different phases according to the signal S1 to serve as the local oscillation signal(s) SLO. The frequency divider 24 may be an integral-multiple frequency divider coupled to the multiplexer 18, and divides the frequency of the signal S1 by an integer N2 (e.g., a value 2) to generate the signals Sb[1] to Sb[M2], such that the frequency of the signals Sb[1] to Sb[M2] is f1/N2.

As previously described, in one embodiment, the frequency f1 of the signal S1 is an integral multiple (one or more times) of the frequency f_LO of the local oscillation signal SLO. Further, as the frequency f1 is a non-integral multiple of the frequency Fvco, through appropriately designed parameters, multiple-frequency harmonics and secondary harmonics do not coincide with the operation frequency Fvco of the oscillator 14. As such, the frequency pulling effect imposed by the local oscillation frequency f_LO upon the oscillator 14 may be effectively suppressed.

In one embodiment, the fundamental frequency Fvco of the oscillator 14 is 3.6 GHz and the integer N=4, so that the frequency f1 of the signal S1 is (4/3)*3.6=4.8 GHz. The frequency divider 24 divides the frequency of the signal S1 by 2 to generate a 2.4 GHz local oscillation signal SLO. It is apparent that the fundamental frequency Fvco is a non-integral multiple of the local oscillation frequency SLO. Therefore, even when multiple-frequency harmonics (e.g., 4.8 GHz and/or 9.6 GHz) are derived from the 2.4 GHz local oscillation frequency due to non-linearity in the communication system 10, the frequency pulling effect imposed by the multiple-frequency harmonics upon the oscillator 14 can be effectively suppressed since the oscillator 14 operates at the 3.6 GHz fundamental frequency.

In another embodiment, the fundamental frequency Fvco of the oscillator 14 is similarly 3.6 GHz and the integer N=4, and so the frequency f1 of the signal S1 is (4/5)*3.6=2.88 GHz. The frequency divider 24 divides the frequency of the signal S1 by 2 to generate a 1.44 GHz local oscillation signal SLO. The fundamental frequency Fvco is also a non-integral multiple of the frequency f_LO of the local oscillation signal S_LO. Similarly, the multiple-frequency harmonics (e.g., 2.88 GHz and/or 5.76 GHz) derived from the 1.44 GHz local oscillation frequency due to non-linearity in the communication system 10 do not coincide with the 3.6 GHz operation frequency of the oscillator 14, thereby effectively suppressing the frequency pulling effect.

When the communication system 10 is to send an RF signal Sr1 according to a baseband signal SB, the mixer 26 coupled to the signals SB and SLO may mix the signals SB and SLO, so as to carry the signal SB to a frequency band of the frequency f_LO to generate an RF signal Sr0. The power amplifier 28 coupled to the mixer 28 amplifies the RF signal Sr0 to generate an RF signal Sr1 that can then be transmitted to a network medium (not shown).

In one embodiment, the frequency f1 of the signal S1 is greater than the frequency Fvco of the oscillator 14. That is, compared to the frequency f1, the oscillator 14 operates at the lower frequency Fvco. Such arrangement offers various benefits. For example, between phase noises, a frequency tuning range and power consumption, the oscillator 14 is entitled to a greater level of freedom and a more flexible trade-off margin.

Figure 2:
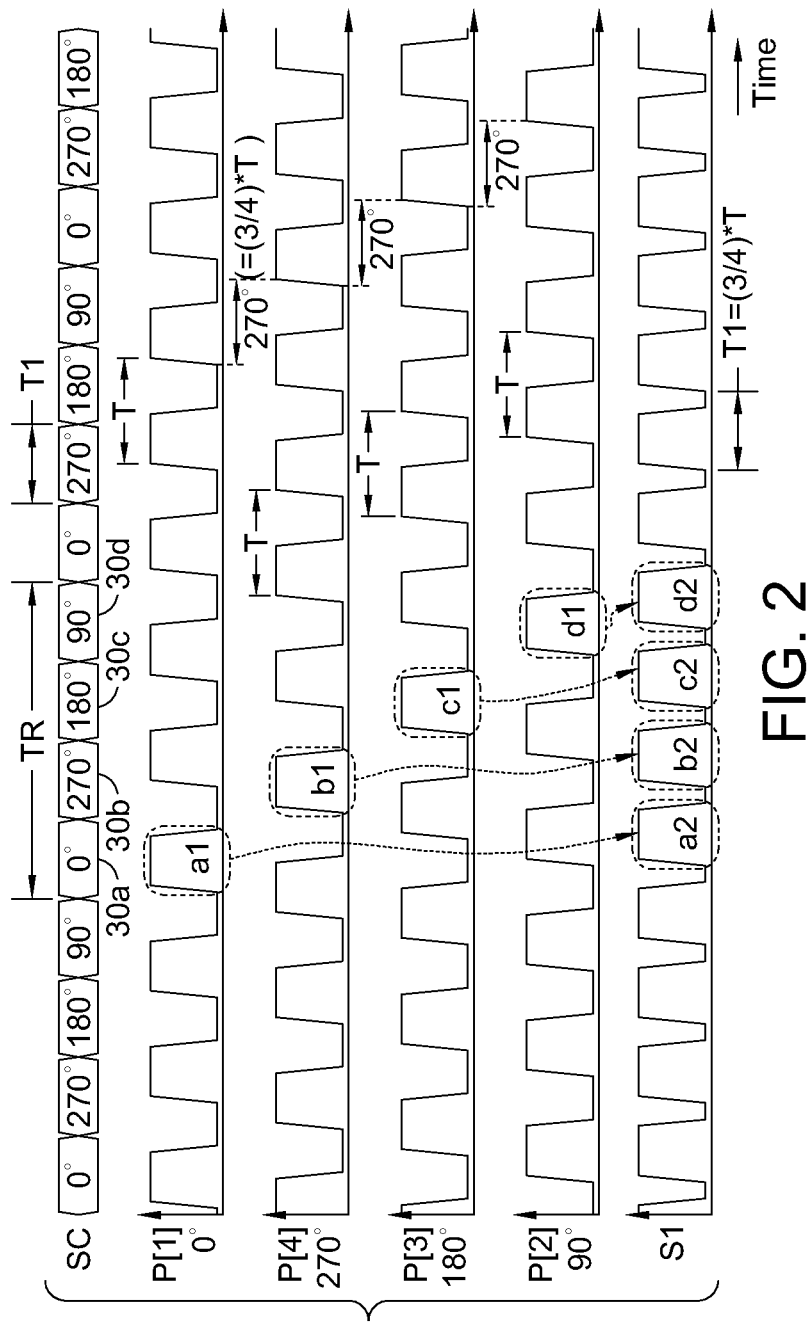
FIG. 2 shows waveforms of associated signals in FIG. 1 according to an embodiment of the present invention.

FIG. 2 shows waveforms of associated signals in the local oscillation generator 12 according to an embodiment. For the waveforms in FIG. 2, the horizontal axis represents the time, and the vertical axis represents the amplitude of the waveforms. In the embodiment in FIG. 2, N=4, the multi-phase circuit 16 provides four signals P[1] to P[4], a period length of the signals P[1] to P[4] is T (i.e., the fundamental period, T=(1/Fvco)), a phase difference between an $n^{th}$ signal P[n] and the signal P[1] is (360*(n−1)/N) degrees, where n=1 to 4.

Under the control of the controller 20, the multiplexer 18 periodically conducts the signals P[1] to P[4] according to a sequence of the signals P[1], P[4], P[3] and P[2] in different time slots, respectively, to form the signal S1. For example, in a time slot 30a, the multiplexer 18 makes a segment a1 of the signal P[1] at 0-degree phase as a segment a2 of the signal S1. In a next time slot 30b, the multiplexer 18 makes a segment b1 of the signal P[4] at a 270-degree phase as a segment b2 of the signal S2. In a next time slot 30c, the multiplexer 18 makes a segment c1 of the signal P[3] in a 180-degree phase as a segment c2 of the signal S1. In a next time slot 30d, the multiplexer 18 makes a segment d1 of the signal P[2] in a 90-degree phase as a segment d2 in the signal S1. After the time slot 30d, the multiplexer 18 repeats the signals P[1], P[4], P[3] and P[2] according to such sequence, and serially connects the segments of the signals P[1], P[4], P[3] and P[2] in the signal S1 in the next four time slots.

More specifically, corresponding to two adjacent time slots, the multiplexer 18 sequentially conducts the signals P[n1] and P[n2] of different phases to serve as the signal S1. The phase difference between the signals P[n2] and P[n1] is (K/N)*360 degrees, which is substantially equivalent to a time difference (K/N)*T, where K an integer smaller than or equal to N and greater than or equal to (N/2). In other words, the phase difference between the signals P[n2] and P[n1] is between 180 degrees and 360 degrees. In equivalence, the time difference between the signals P[n2] and P[n1] is between periods (T/2) and T. Since the multiplexer 18 repeatedly conducts the same signal P[n] every N time slots, a period TR (the conduction period) of cyclic operations of the multiplexer 18 is (K*T)=N*(K/N)*T. According to operations of the multiplexer 18, the period T1 (the synthesized period) of the signal S1 is equal to (K/N)*K, i.e., the time length of each time slot. The frequency f1 of the signal S1 is a reciprocal of the period T1, and so a ratio of the frequency f1 to the frequency Fvco is (N/K).

For example, in the embodiment in FIG. 2, N is an integer 4 and K is an integer 3. The multiplexer 18 conducts the signal P[1] in the 0-degree phase in the time slot 30a, and thus selects to conduct the signal P[4] in the 270-degree phase (3/4*2π)) in the next time slot 30b. Similarly, from the time slot 30b to the time slot 30c, the multiplexer 18 switches to the signal P[3] from the signal P[4]. The phase difference between the signals P[3] and P[4] is also 270 degrees since the 270-degree phase of the signal P[4] plus 270 degrees is a 180-degree phase (6/4*2π)=2/4(2π)), i.e., the phase of the signal P[3].

Similarly, from the time slot 30c to the time slot 30d, the multiplexer 18 switches from the signal P[3] to the signal P[2]. The phase difference between the signal P[2] and the signal P[3] is also 270 degrees since the 180-degree phase of the signal P[3] plus 270 degrees is a 90-degree phase (5/4*(2π)=1/4*(2π)), i.e., the phase of the signal P[2]. After the time slot 30d, the multiplexer 18 again switches from the signal P[2] to the signal P[1]. The 90-degree phase of the signal P[2] plus 270 degrees is a 0-degree phase (4/4*(2π)=0), i.e., the phase of the signal P[1]. That is, two signals conducted in adjacent time slots (e.g., the signals P[n2] and P[n1]) have a time difference (K/N)*T. Under such operations, the period of the signal S1 is (3/4)*T. That is, the frequency f1 of the signal S1 is f1=(4/3)*Fvco, which is a non-integral multiple of the frequency Fvco.

Figure 3:
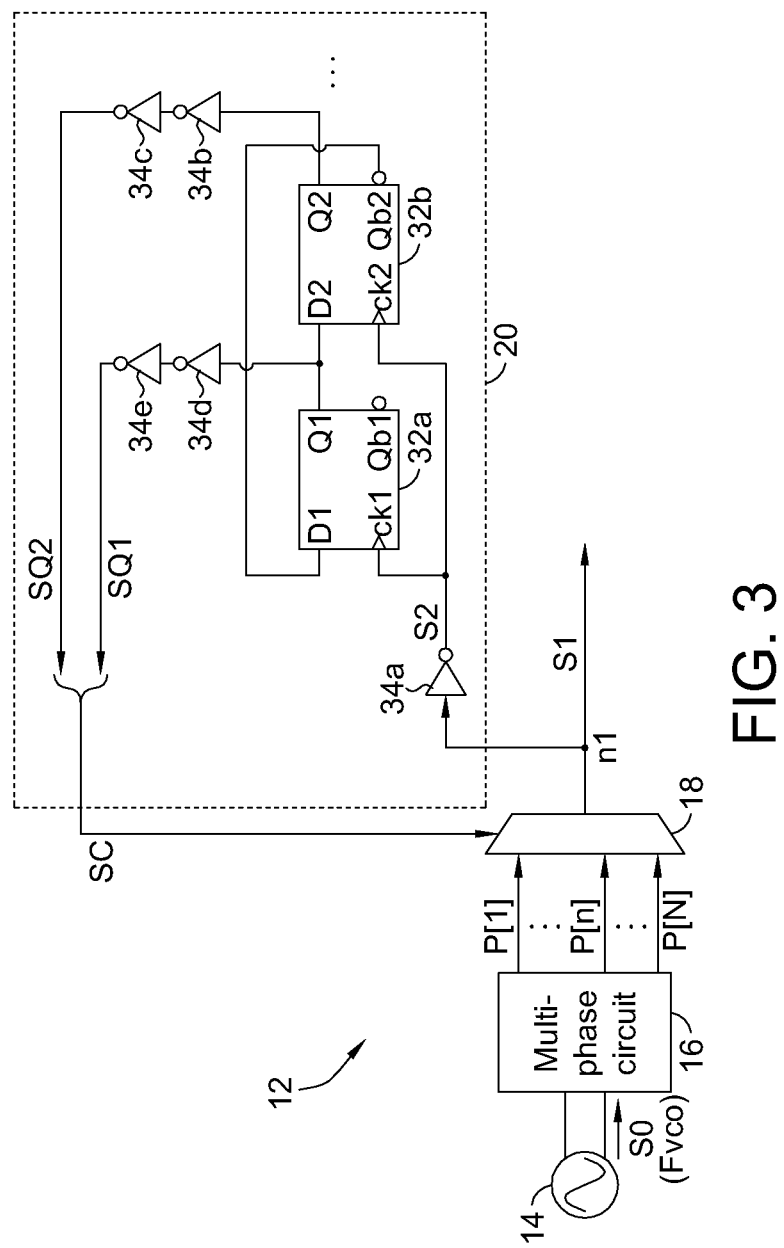
FIG. 3 shows a controller for controlling a multiplexer in FIG. 1 according to an embodiment of the present invention.
Figure 4:
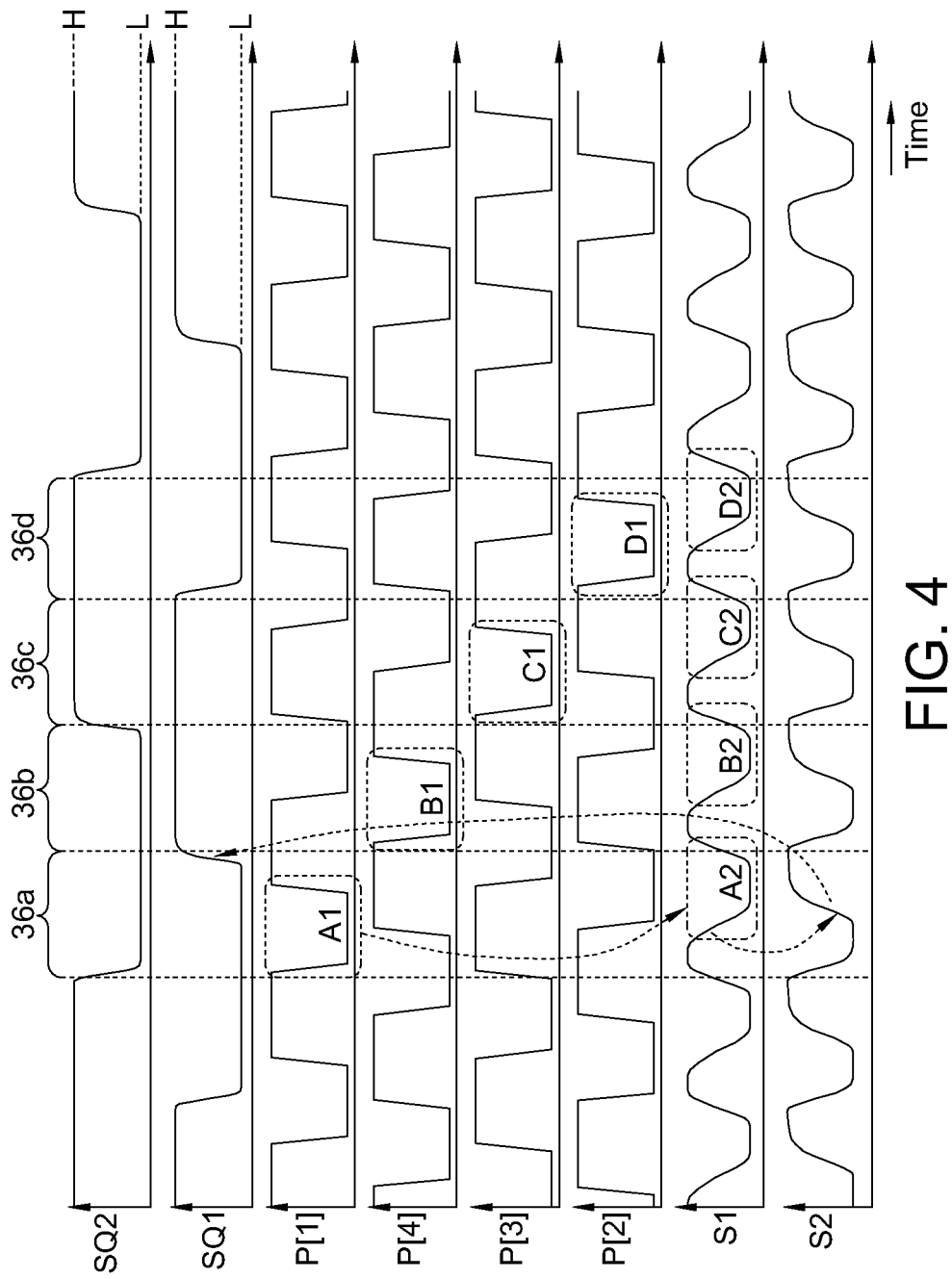
FIG. 4 shows waveforms of associated signals in FIG. 3 according to an embodiment of the present invention.

FIG. 3 shows a controller 20 according to an embodiment of the present invention; FIG. 4 shows waveforms of associated signals in FIG. 3 according to an embodiment of the present invention. For the waveforms, the horizontal axis represents the time, and the vertical axis represents the amplitude of the waveforms. In the embodiment in FIG. 3, the controller 20 comprises two flip-flops 32a and 32b, and inverters 34a to 34e. The flip-flop 32a has an input end D1, a clock end ck1, a positive output end Q1 and an inverted negative output end Qb1. According to signal trigger (e.g., a rising edge trigger) of the clock end ck1, the flip-flop 32a samples the signal at the input end D1, and outputs a sample result and an inverted sample result to the output ends Q1 and Qb1, respectively. Similarly, the flip-flop 32b has an input end D2, a clock end ck2, a positive output end Q2 and an negative output end Qb2.

In the controller 20, the inverter 34a inverts the signal S1 into a signal S2, and the clock ends ck1 and ck2 are coupled to the signal S2. The input end D2 and the negative output end Qb2 are coupled to the positive output end Q1 and the input end D1, respectively. The inverters 34b and 34c are coupled in series to the positive output end Q2. The inverters 34d and 34e are coupled in series to the positive output end Q1. The controller 20 provides the control signal SC according to a signal SQ1 at the positive output end Q1 and a signal SQ2 at the positive output end Q2. For example, the signals SQ1 and SQ2 may be regarded as two bits of the control signal SC. As shown in FIG. 4, in the embodiment, for the control signal SC=0 corresponding to (SQ1, SQ2)=(0, 0), the correspondingly conducted signal is P[1]; for the control signal SC=2 corresponding to (SQ1, SQ2)=(1, 0), the correspondingly conducted signal is P[4]; for the control signal SC=3 corresponding to (SQ1, SQ2)=(1, 1), the correspondingly conducted signal is P[3]; for the control signal SC=1 corresponding to (SQ1, SQ2)=(0, 1), the correspondingly conducted signal is P[2].

As shown in FIG. 4, in a time slot 36a, the signals SQ1 and SQ2 are both at a level L, i.e., (SQ1, SQ2)=(0, 0). The control signal SC synthesized from the signals SQ1 and SQ2 renders the multiplexer 18 to conduct the signal P[1], and a segment A1 of the signal P[1] forms a segment A2 of the signal S1. A falling edge of the segment A2 is thus inverted by the inverter 34a into a rising edge of the signal S2. Triggered by the rising edge, the flip-flop 32a samples an inverted level H at the negative output end Qb2. As such, the signal SQ1 transits from the level L to the level H while the flip-flop 32b maintains at the level L, and (SQ1, SQ2)=(1, 0) at this point. In response to the transition of the signal SQ1, the control signal SC also enters transition such that the multiplexer 18 correspondingly switches to conduct the signal P[4] at the time slot 36b, with a segment B1 of the signal P[4] forming a segment B2 of the signal S1. Similarly, a falling edge of the segment B2 is also inverted to trigger the flip-flops 32a and 32b to further prompt the signal SQ2 into transition, i.e., (SQ1, SQ2)=(1, 1), such that the multiplexer 18 correspondingly switches to conduct the signal P[3] at the time slot 36c, and so forth. The controller 20 may be regarded as a phase rotation circuit that changes the control signal SC at the transition (e.g., the falling edge of the signal S1) of the signal S1, in a way that the multiplexer 18 switches from one signal P[n1] of the signals P[1] to P[N] to conduct another signal P[n2]. In the embodiment in FIG. 3, the multiplexer 18 may be a digital multiplexer. Alternatively, the controller 20 may be formed by a current mode logic (CML), and the multiplexer 18 may be an analog multiplexer based on operations of small signals.

Figure 7:
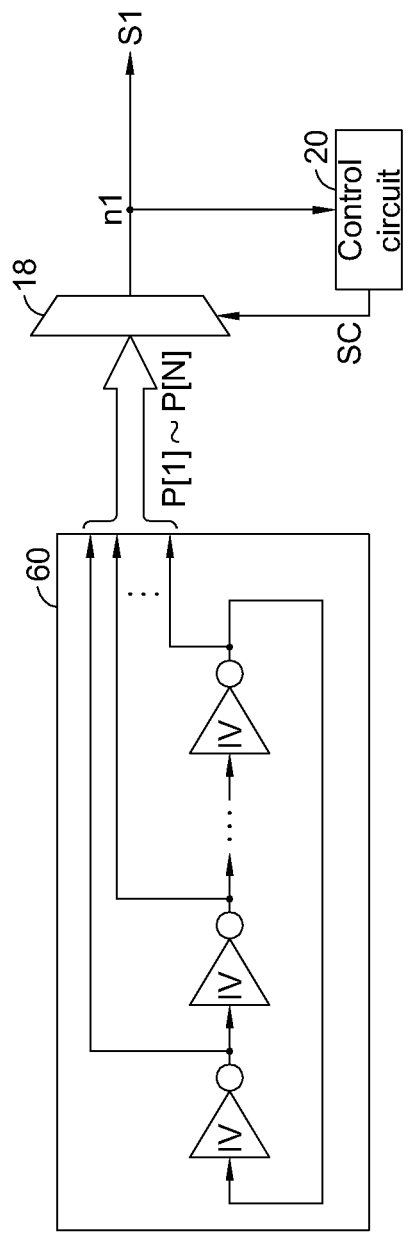
FIG. 7 shows a circuit for generating multi-phase oscillation signals according to an embodiment of the present invention.

Details of the multi-phase circuit 16 providing the signals P[1] to P[N] in various embodiments may be described below. In one embodiment, the oscillator 14 operates at a J-multiple frequency of the frequency Fvco, and the multi-phase circuit 16 generates an N number of signals P[1] to P[N] of different phases by frequency dividing using the value J. In one embodiment, the oscillator 14 provides the signal S0 of the frequency Fvco, and the multi-phase circuit 16 is a polyphase filter that generates the signals P[1] to P[N] according to the signal S0. In one embodiment, functions of the multi-phase circuit 16 and the oscillator 14 are integrated and implemented by a quadrature oscillator that provides four signals P[1] to P[4]. Alternatively, as shown in FIG. 7, the multi-phase circuit 16 may be implemented by a ring oscillator 60, which receives the signal S0 of the frequency Fvco provided by another oscillator 14 and outputs an N number of signals P[1] to P[N] of different phases. The ring oscillator 60 comprises a plurality of serially connected amplifiers IV, each of which has an output end coupled to an input end of another amplifier IV and is capable of outputting one of the signals P[1] to P[N]. The amplifiers IV may be single-end input/output (inverting) amplifiers, or a dual-end (differential) input/output (inverting) amplifiers. Further, in one embodiment, the functions of the multi-phase circuit 16 and the oscillator 14 may be integrated and implemented by a ring oscillator 60. Such architecture has a wider frequency tunable range with yet more noticeable phase noises. In the embodiment in FIG. 1 (FIG. 3), the local oscillation generator 12 may also comprise a bandpass filter (e.g., an inductor-capacitor buffer, not shown) coupled to the multi-phase circuit 22 to perform bandpass filter on the signal S1, so as to render the filtered signal to approximate an ideal waveform of the local oscillation signal. The pass-band of the bandpass filter may be centered at the frequency f1.

Figure 5:
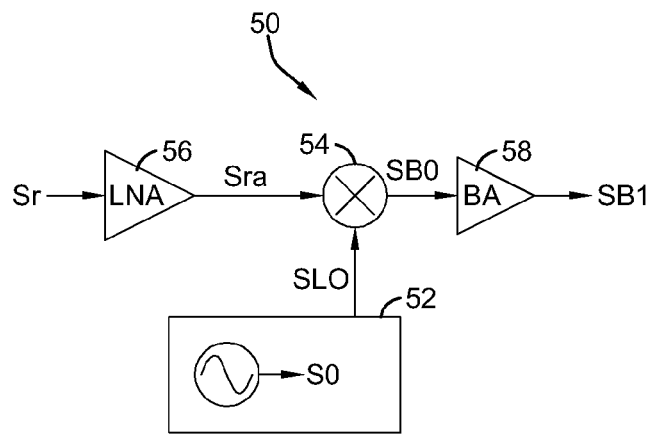
FIG. 5 shows a receiver according to an embodiment of the present invention.

FIG. 5 shows a communication system 50 according to an embodiment of the present invention. The communication system 50 comprises a local oscillation generator 52, a low-noise amplifier 56, a mixer 54 and a baseband amplifier 58, which jointly implement a receiver of a wireless communication network. The local oscillation generator 52 may be the local oscillation generator 12 in FIG. 1, and provides a signal SLO as a local oscillation signal according to a fundamental oscillation signal S0. When receiving an RF signal Sr, the low-noise amplifier 56 amplifies the RF signal Sr to generate an amplified RF signal Sra. The mixer 54, coupled to the local oscillation generator 52 and the low-noise amplifier 56, mixes the amplified RF signal Sra with the local oscillation signal SLO to accordingly provide a baseband signal SB0. The baseband amplifier 58, coupled to the mixer 54, amplifies the baseband signal SB0 to provide an amplified baseband signal SB1.

Figure 6:
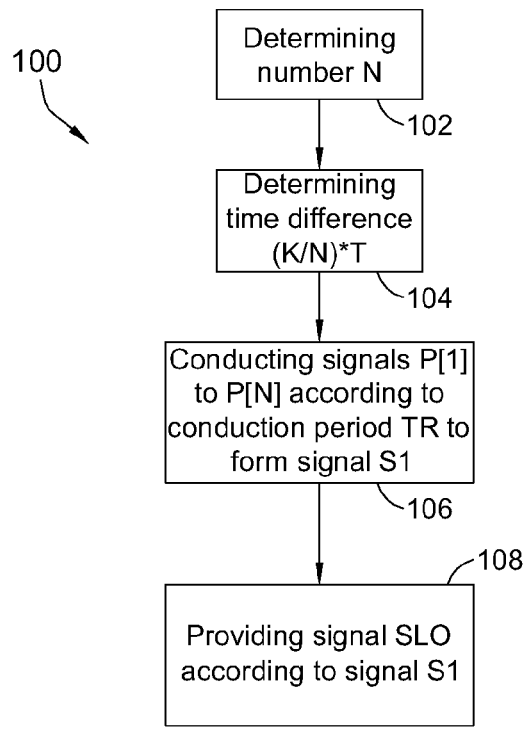
FIG. 6 shows a flowchart of a process according to an embodiment of the present invention.

FIG. 6 shows a process 100 according to an embodiment of the present invention. The process 100, applicable to a communication system, e.g. the communication systems in FIGS. 1 and 5, provides a local oscillation signal, e.g, the signal SLO. Steps of the process 100 are described below.

In step 102, the number of multi-phase oscillation signals P[1] to P[N] is determined, i.e., the number N is determined. The multi-phase oscillation signals P[1] to P[N] are generated from a fundamental oscillation signal S0, and have a fundamental frequency Fvo and a fundamental period T.

In step 104, a time difference $(K/N)*T$ is determined. A phase difference $(K/N)*360$ degrees, equivalent to a time difference $(K/N)*T$, between two differently-phased signals P[n1] and P[n2] conducted in two arbitrary adjacent time slots is designed, where K is an integer. As such, a conduction period TR is equal to the time difference $(K/N)*T$ multiplied by the number N, i.e., $K*T$.

In step 106, one of the multi-phase oscillation signals is periodically conducted in a plurality of different time slots $(K/N)*T$ according to the conduction period TR to form an output oscillation signal S1 having a synthesized frequency $f1=(N/K)*Fvco$. The synthesized frequency f1 of the output oscillation signal S1, $f1=(N/K)*Fvco$, is different from the fundamental frequency Fvco, i.e., the number N is not equal to K.

In step 108, a local oscillation signal SLO is provided according to the output oscillation signal S1.

In conclusion, compared to the prior art, the local oscillation generation technique of the present invention prevents multiple-integral harmonics of a local oscillation frequency from overlapping with a fundamental frequency of an oscillator, so that a frequency pulling effect imposed by a communication system upon the oscillator can be effectively suppressed to improve communication quality.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A local oscillation generator, applied to a communication system, for providing a local oscillation signal, the local oscillation generator comprising:
    a multi-phase circuit, configured to provide a plurality of multi-phase oscillation signals having a same fundamental frequency and different phases; and
    a multiplexer, coupled to the multi-phase circuit, for continuously conducting one of the multi-phase oscillation signals in a plurality of adjacent time slots, respectively, to form an output oscillation signal,
    wherein the local oscillation generator provides the local oscillation signal according to the output oscillation signal, a synthesized frequency of the output oscillation signal is different from the fundamental frequency, a phase difference exists between two of the multi-phase oscillation signals conducted by the multiplexer in two adjacent time slots, and a ratio of the fundamental frequency to the synthesized frequency is equal to a ratio of the phase difference to 360 degrees.

2. The local oscillation generator according to claim 1, wherein the multiplexer periodically conducts the same multi-phase oscillation signal according to a conduction period, which is an integral multiple of a time difference between two of the multi-phase oscillation signals conducted by the multiplexer in two adjacent time slots.

3. The local oscillation generator according to claim 1, wherein the multi-phase oscillation signals have a same fundamental period, and a ratio of a time length of the time slots to the fundamental period is equal to a ratio of the fundamental frequency to the synthesized frequency.

4. The local oscillation generator according to claim 1, wherein the synthesized frequency is a non-integral multiple of the fundamental frequency.

5. The local oscillation generator according to claim 1, wherein the fundamental frequency is a non-integral multiple of the synthesized frequency.

6. The local oscillation generator according to claim 1, further comprising:
a controller, coupled to the multiplexer, for providing a control signal according to the output oscillation signal,
wherein the multiplexer conducts one of the multi-phase oscillation signals according to the control signal to form the output oscillation signal.

7. The local oscillation generator according to claim 6, wherein the controller controls the multiplexer to correspondingly switch from one of the multi-phase oscillation signals to conduct one other multi-phase oscillation signal in response to the control signal at a transition of the output oscillation signal.

8. The local oscillation generator according to claim 6, wherein the controller comprises:
a first flip-flop, comprising:
a first input end;
a first clock end; and
a first output end,
wherein the first clock end is coupled to the output oscillation signal; and
a second flip-flop, comprising:
a second input end;
a second clock end;
a second positive output end; and
a second negative output end,
wherein the second input end, the second clock end and the second negative output end are coupled to the first output end, the output oscillation signal and the first input end, respectively;
wherein the controller provides the control signal according to signals at the first output end and the second positive output end.

9. The local oscillation generator according to claim 1, further comprising:
an oscillator, coupled to the multi-phase circuit, for providing a fundamental oscillation signal having a frequency as the fundamental frequency;
wherein the multi-phase circuit is a poly-phase filter configured to generate the multi-phase oscillation signals according to the fundamental oscillation frequency.

10. The local oscillation generator according to claim 1, wherein the multi-phase circuit is a ring oscillator.

11. The local oscillation generator according to claim 1, further comprising:
an oscillator, coupled to the multi-phase circuit, for providing a fundamental oscillation signal having a frequency as the fundamental frequency,
wherein the multi-phase circuit is a ring oscillator configured to generate the multi-phase oscillation signals according to the fundamental oscillation frequency.

12. The local oscillation generator according to claim 1, wherein the communication system comprises:
a mixer, coupled to the local oscillation generator, for mixing a baseband signal with the local oscillation signal to provide a radio-frequency (RF) signal; and
a power amplifier, coupled to the mixer, for amplifying the RF signal.

13. The local oscillation generator according to claim 1, wherein the communication system comprises:
a mixer, coupled to the local oscillation generator, for mixing an RF signal with the local oscillation signal to provide a baseband signal; and
a power amplifier, coupled to the mixer, for amplifying the baseband signal.

14. The local oscillation generator according to claim 1, further comprising:
a second multi-phase circuit, coupled to the multiplexer, for generating a plurality of multi-phase local oscillation signals according to the output oscillation signal,
wherein the multi-phase local oscillation signals have a same second fundamental frequency and different phases, the second fundamental frequency is equal to a frequency of the output oscillation signal, and the local oscillation generator provides the local oscillation signal according to the multi-phase local oscillation signals.

15. The local oscillation generator according to claim 1, further comprising:
a frequency divider, coupled to the multiplexer, for frequency dividing the output oscillation signal to generate the local oscillation signal.

16. A communication system, comprising a local oscillation generator for providing a local oscillation signal, the local oscillation generator comprising:
a multi-phase circuit, for providing a plurality of multi-phase oscillation signals having a same fundamental frequency and different phases; and
a multiplexer, coupled to the multi-phase circuit, for continuously conducting one of the multi-phase oscillation signals in a plurality of adjacent time slots, respectively, to form an output oscillation signal,
wherein the local oscillation generator provides the local oscillation signal according to the output oscillation signal, a synthesized frequency of the output oscillation signal is different from the fundamental frequency, a phase difference exists between two of the multi-phase oscillation signals conducted by the multiplexer in two adjacent time slots, and a ratio of the fundamental frequency to the synthesized frequency is equal to a ratio of the phase difference to 360 degrees.

17. The communication system according to claim 16, wherein the multiplexer periodically conducts the same multi-phase oscillation signal according to a conduction period, which is an integral multiple of a time difference between two of the multi-phase oscillation signals conducted by the multiplexer in two adjacent time slots.

18. The communication system according to claim 16, wherein the multi-phase oscillation signals have a same fundamental period, and a ratio of a time length of the time slots to the fundamental period is equal to a ratio of the fundamental frequency to the synthesized frequency.

19. The communication system according to claim 16, further comprising:
a controller, coupled to the multiplexer, for providing a control signal according to the output oscillation signal,
wherein the multiplexer conducts one of the multi-phase oscillation signals according to the control signal to form the output oscillation signal.

20. The communication system according to claim 19, wherein the controller comprises:
a first flip-flop, comprising a first input end, a first clock end and a first output end, wherein the first clock end is coupled to the output oscillation signal; and
a second flip-flop, comprising a second input end, a second clock end, a second positive output end and a second negative output end, wherein the second input end, the second clock end and the second negative output end are coupled to the first output end, the output oscillation signal and the first input end, respectively;

wherein the controller provides the control signal according to signals at the first output end and the second positive output end.

21. The communication system according to claim 16, further comprising:
an oscillator, coupled to the multi-phase circuit, for providing a fundamental oscillation signal having a frequency as the fundamental frequency;
wherein the multi-phase circuit is a poly-phase filter, configured to generate the multi-phase oscillation signals according to the fundamental oscillation frequency.

22. The communication system according to claim 16, further comprising:
a mixer, coupled to the local oscillation generator, for mixing a baseband signal with the local oscillation signal to provide an RF signal; and
a power amplifier, coupled to the mixer, for amplifying the RF signal.

23. The communication system according to claim 16, further comprising:
a second multi-phase circuit, coupled to the multiplexer, for generating a plurality of multi-phase local oscillation signals according to the output oscillation signal;
wherein the multi-phase local oscillation signals have a same second fundamental frequency and different phases, the second fundamental frequency is equal to a frequency of the output oscillation signal, and the local oscillation generator provides the local oscillation signal according to the multi-phase local oscillation signals.

24. The communication system according to claim 16, further comprising:
a frequency divider, coupled to the multiplexer, for frequency dividing the output oscillation signal to generate the local oscillation signal.

25. The communication system according to claim 16, further comprising a receiver, and the local oscillation generator is applied to the receiver.

26. The communication system according to claim 25, wherein the receiver comprises:
a low-noise amplifier, for amplifying an RF signal to generate an amplified RF signal;
a third mixer, coupled to the local oscillation generator, for mixing the amplified RF signal with the local oscillation signal to accordingly provide a baseband signal; and
a baseband amplifier, coupled to the third mixer, for amplifying the baseband signal.

27. A method for local oscillation generation for a communication system, for providing a local oscillation signal, comprising:
determining a number of a plurality of multi-phase oscillation signals having a same fundamental frequency and different phases;
determining a time difference, wherein a conduction period is equal to the time difference multiplied by the number;
continuously conducting one of the multi-phase oscillation signals in a plurality of adjacent time slots according to the conduction period to form an output oscillation signal; and
providing the local oscillation signal according to the output oscillation signal, wherein a synthesized frequency of the output oscillation signal is different from the fundamental frequency,
wherein the multi-phase oscillation signals have a same fundamental period, and a ratio of a time length of the time slots to the fundamental period is equal to a ratio of the fundamental frequency to the synthesized frequency.

28. The method according to claim 27, wherein a time difference exists between two of the multi-phase oscillation signals conducted by the multiplexer in two adjacent time slots, and the conduction period is an integral multiple of the time difference.

29. The method according to claim 27, wherein the synthesized frequency is a non-integral multiple of the fundamental frequency.

30. The method according to claim 27, wherein the fundamental frequency is a non-integral multiple of the synthesized frequency.

* * * * *